(12) United States Patent
Zhang et al.

(10) Patent No.: US 12,035,463 B2
(45) Date of Patent: Jul. 9, 2024

(54) DISPLAY PANEL, DISPLAY DEVICE AND TERMINAL APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Shuang Zhang, Beijing (CN); Xiaoxia Huang, Beijing (CN); Bing Ji, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 329 days.

(21) Appl. No.: 17/761,662

(22) PCT Filed: May 19, 2021

(86) PCT No.: PCT/CN2021/094718
§ 371 (c)(1),
(2) Date: Mar. 18, 2022

(87) PCT Pub. No.: WO2021/254081
PCT Pub. Date: Dec. 23, 2021

(65) Prior Publication Data
US 2022/0330416 A1    Oct. 13, 2022

(30) Foreign Application Priority Data

Jun. 19, 2020  (CN) .......................... 202010568363.0

(51) Int. Cl.
*H05K 1/02* (2006.01)
*H10K 59/12* (2023.01)
*H10K 59/40* (2023.01)

(52) U.S. Cl.
CPC ... *H05K 1/028* (2013.01); *H05K 2201/09036* (2013.01); *H05K 2201/10128* (2013.01); *H10K 59/12* (2023.02); *H10K 59/40* (2023.02)

(58) Field of Classification Search
CPC ......... H05K 1/028; H05K 2201/09036; H05K 2201/10128; H10K 59/40
(Continued)

(56) References Cited

U.S. PATENT DOCUMENTS 9,256,338 B2    2/2016  Yeh et al.
2008/0074853 A1*  3/2008  Jang ....................... H05K 1/189
                                                              361/749
(Continued)

FOREIGN PATENT DOCUMENTS

CN    204069479 U    12/2014
CN    104703388 A    6/2015
(Continued)

OTHER PUBLICATIONS

International Search Report and Written Opinion for International Application No. PCT/CN2021/094718 mailed Jul. 27, 2021.

*Primary Examiner* — Andargie M Aychillhum
(74) *Attorney, Agent, or Firm* — Perilla Knox & Hildebrandt LLP; Kenneth A. Knox

(57) ABSTRACT

Disclosed are a display panel, a display device, and a terminal apparatus. The display panel comprises a display substrate having a backlight surface and a main flexible circuit board. The main flexible circuit board comprises a connection section, a fixed section and a test section. The connection section is arranged on the backlight surface, and has an outer peripheral surface comprising a first side and a second side opposite to each other. The fixed section is attached and fixed onto the backlight surface, and having one end connected to the first side and another end extending towards an end of the first side away from the second side.

(Continued)

The test section has one end connected to the first side, and another end comprising a connection port.

19 Claims, 7 Drawing Sheets

(58) Field of Classification Search
USPC .......................................................... 361/749
See application file for complete search history.

(56) References Cited

U.S. PATENT DOCUMENTS

| | | |
|---|---|---|
| 2011/0037717 A1 | 2/2011 | Yeh et al. |
| 2015/0036300 A1* | 2/2015 | Park .................... G02F 1/1345 |
| | | 156/212 |
| 2016/0109989 A1 | 4/2016 | Yeh et al. |

FOREIGN PATENT DOCUMENTS

| | | |
|---|---|---|
| CN | 204578894 U | 8/2015 |
| CN | 207283905 U | 4/2018 |
| CN | 110049616 A | 7/2019 |
| CN | 209930344 U | 1/2020 |
| CN | 212086585 U | 12/2020 |

* cited by examiner

DISPLAY PANEL, DISPLAY DEVICE AND TERMINAL APPARATUS

CROSS REFERENCE TO RELATED APPLICATION(S)

The present application is a 35 U.S.C. § 371 national phase application of International Application No. PCT/CN2021/094718 filed on May 19, 2021, which claims the benefit of and priority to Chinese Patent Application No. 202010568363.0, filed on Jun. 19, 2020, and titled as "display panel, display device and terminal apparatus," the contents of both of which being incorporated by reference in their entireties herein.

TECHNICAL FIELD

The present disclosure relates to the field of display technology and, in particular, to a display panel, a display device, and a terminal apparatus.

BACKGROUND

For terminal apparatuses such as mobile phones and computers, the display panel is an indispensable part. In the production process of the terminal apparatus, in order to check whether the display panel is qualified, it is necessary to apply a test signal through the circuit board of the display panel to perform tests such as a lighting test. During the test process, the circuit board needs to be connected with the test device. The existing test method is likely to cause damages to the circuit board, which makes the display panel unable to be used normally.

It should be noted that the information disclosed in the above Background section is only for enhanced understanding of the background of the present disclosure, and therefore may contain information that does not constitutes the prior art that is already known to a person of ordinary skills in the art.

SUMMARY

The purpose of the present disclosure is to provide a display panel, a display device, and a terminal apparatus.

According to an aspect of the present disclosure, there is provided a display panel, including a display substrate and a main flexible circuit board. The display substrate has a backlight surface.

The main flexible circuit board includes: a connection section, arranged on the backlight surface, and having an outer peripheral surface including a first side and a second side opposite to each other; a fixed section, attached and fixed onto the backlight surface, and having one end connected to the first side, and another end extending towards to an end of the first side away from the second side; and a test section, having one end connected to the first side, and another end including a connection port.

A side of the test section close to the fixed section is in a transitional connection with the first side through a crack relief groove. The crack relief groove penetrates through the main flexible circuit board in a direction perpendicular to the backlight surface. In an extension direction of the orthographic projection of the first side on the backlight surface, the depth of the crack relief groove is not greater than 10% of the width of the test section. The test section is a flexible structure and configured to switch between the first state and the second state.

In the first state, the test section is attached onto the backlight surface, and the connection port is located within an edge of the display substrate.

In the second state, at least a part of the test section is separated from the backlight surface, and is bent towards an end of the second side away from the first side, and the connection port extends out of the edge of the display substrate.

In an exemplary embodiment of the present disclosure, the orthographic projection of the crack relief groove on the backlight surface is arc-shaped.

In an exemplary embodiment of the present disclosure, the crack relief groove is in a smooth and transitional connection with a side of the test section close to the fixed section through an arc-shaped transition surface. The crack relief groove is in a smooth and transitional connection with the first side.

In an exemplary embodiment of the present disclosure, the orthographic projection of the crack relief groove on the backlight surface and the orthographic projection of the transition surface on the backlight surface are equal in radius.

In an exemplary embodiment of the present disclosure, the orthographic projection of the crack relief groove on the backlight surface and the orthographic projection of the transition surface on the backlight surface have a radius from 0.3 mm to 0.7 mm.

In an exemplary embodiment of the present disclosure, the orthographic projection of the crack relief groove on the backlight surface is in a U shape, and the crack relief groove has two opposite side walls. One of the two opposite side walls is connected to a side of the test section close to the fixed section, and the other of the two opposite side walls intersects with the first side.

In an exemplary embodiment of the present disclosure, there is a plurality of crack relief grooves, sequentially connected between the first side and a side of the test section close to the fixed section. Two adjacent crack relief grooves are in a smooth and transitional connection.

In an exemplary embodiment of the present disclosure, the crack relief groove has two opposite side walls, and the distance between the two opposite side walls gradually decreases toward the second side.

In an exemplary embodiment of the present disclosure, the connection section is a flexible structure, and is configured to make detachable contact with the backlight surface when the test section is in the first state.

In an exemplary embodiment of the present disclosure, the display substrate has a light-transmissive area, located between the fixed section and the test section in the first state.

The display panel also includes: a fingerprint sense unit, arranged on the backlight surface, and located between the fixed section and the test section in the first state. The light-transmissive area is located within the projection of the fingerprint sense unit on the backlight surface.

In an exemplary embodiment of the present disclosure, a side of the fixed section close to the test section is provided with an avoidance hole, configured to penetrate through the fixed section in a direction perpendicular to the backlight surface. A partial outline of the light-transmissive area is located in the avoidance hole and matches the avoidance hole in shape.

In an exemplary embodiment of the present disclosure, a side of the fixed section close to the test section is in a smooth and transitional connection with the first side through a connection groove, and the connection groove penetrates through the main flexible circuit board in a direction perpendicular to the backlight surface.

In an exemplary embodiment of the present disclosure, the display panel further includes: a touch layer, disposed on a side of the display substrate away from the backlight surface or integrated in the display substrate; and a flexible touch circuit board, connected with the touch layer, folded to the backlight surface, and connected with the fixed section.

According to an aspect of the present disclosure, there is provided a display device, including the display panel as described in any one of the above embodiments.

According to an aspect of the present disclosure, a terminal apparatus is provided, including the display device as described in any one of the above embodiments.

It is to be understood that the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the present specification, illustrate embodiments consistent with the present disclosure and together with the present description serve to explain the principle of the present disclosure. Understandably, the drawings in the following description are representative of only some embodiments of the present disclosure, and for those of ordinary skill in the art, other drawings may also be obtained from these drawings without creative efforts.

DETAILED DESCRIPTION

Figure 1:
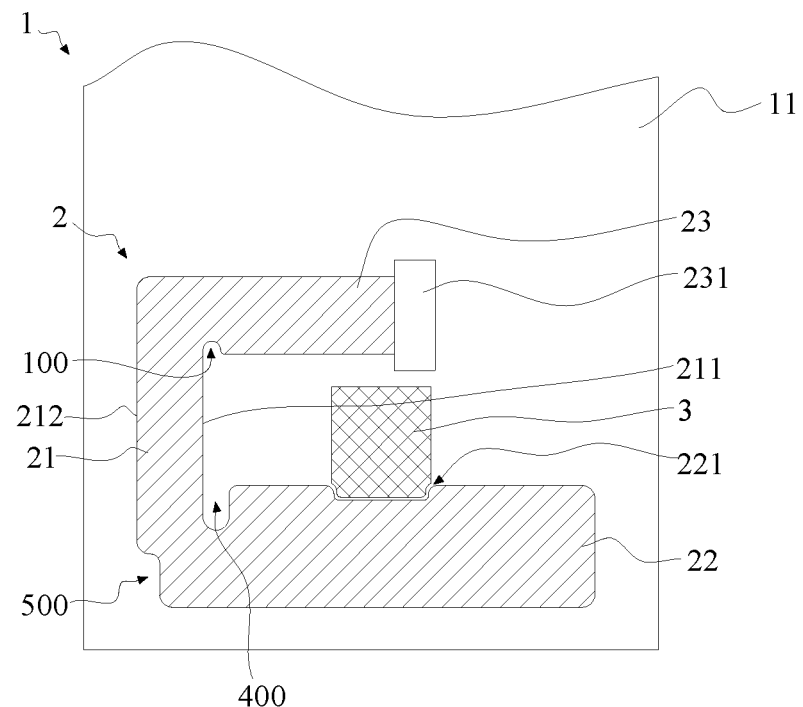
FIG. 1 is a partial top view of a test section in a first state of the display panel according to an embodiment of the present disclosure.

Example embodiments will now be described more fully with reference to the accompanying drawings. Example embodiments, however, may be embodied in various forms and should not be construed as limited to embodiments set forth herein. Rather, these embodiments are provided so that the present disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "upper" and "lower" are used in the specification to describe the relative relationship of one component represented by an icon to another component, these terms are used in the specification only for convenience, such as according to the direction shown in the example described. It will be appreciated that if the device represented by the icon is turned upside down, the components described as being located "on" the device will become the components being located on "under" the device. When a certain structure is located "on" another structure, it may mean that the certain structure is integrally formed on the other structure, or that the certain structure is "directly" arranged on the other structure, or that the certain structure is "indirectly" arranged on the other structure through a third structure.

The terms such as "a", "an", "the", and "said" are used to indicate the presence of one or more elements or components, etc. The terms such as "including" and "having" are used to indicate an open-ended inclusion, which means that additional elements or components, etc. may be present in addition to the listed elements or components, etc. The terms such as "first", "second", etc. are used only as labels, not to limit the number of objects to which they are referred.

In the related art, the display panel has a Main Flexible Printed Circuit (MFPC), which is used to transmit the drive signal and the power signal from the main board of the terminal apparatus to the display panel for image display. For a terminal apparatus with a display panel, such as a mobile phone, in the production process, the display panel needs to be tested by a test device for testing the display panel. For example, when a lighting test is performed by a lighting test device, a test signal may be input to the display panel by the lighting test device to make it present a specific pattern, thereby determining whether the display panel displays normally.

During testing, the test device needs to be connected to the main flexible circuit board of the display panel, in order to input the test signal. In order to facilitate the connection, it is usually necessary to fold the main flexible circuit board so that the connection port thereof extends out of the display panel for connection with the test device. However, during the folding process, it is easy to cause the main flexible circuit board to tear. When the pressure is too large, the phenomenon of "dead break" that exceeds the elastic limit and cannot be recovered is prone to occur, thus affecting the normal display of the display panel, and even causing the display panel to be scrapped. If the main flexible circuit board is not folded, it needs to be connected to the test device through an adapter device, which increases the cost, and may still leads to problems such as tearing during connection and detachment of the adapter device.

Embodiments of the present disclosure provide a display panel. As shown in FIGS. 1 to 4, the display panel includes a display substrate 1 and a main flexible circuit board 2. The display substrate 1 has a backlight surface 11. The main flexible circuit board 2 includes a connection section 21, a fixed section 22, and a test section 23.

The connection section 21 is disposed on the backlight surface 11. The outer peripheral surface of the connection section 21 includes a first side 211 and a second side 212 that are opposite to each other.

The fixed section 22 is attached and fixed onto the backlight surface 11. One end of the fixed section 22 is connected to the first side 211, and the other end of the fixed section 22 extends to an end of the first side 211 away from the second side 212.

One end of the test section 23 is connected to the first side 211, and the other end of the test section 23 has a connection port 231. The side of the test section 23 close to the fixed section 22 and the first side 211 are in a transitional connection through the crack relief groove 100. The crack relief groove 100 penetrates through the main flexible circuit board 2 in a direction perpendicular to the backlight surface 11. In the extension direction of the orthographic projection of the first side 211 on the backlight surface 11, the depth of the crack relief groove 100 is not greater than 10% of the width of the test section. The test section 23 is a flexible structure that is configured to switch between the first state and the second state.

In the first state, the test section 23 is attached onto the backlight surface 11, and the connection port 231 is located within an edge of the display substrate 1.

In the second state, at least a part of the test section 23 is separated from the backlight surface 11, and is folded towards an end of the second side 212 away from the first side 211, and the connection port 231 extends out of the edge of the display substrate 1.

In the display panel according to an embodiment of the present disclosure, as shown in FIG. 1, the test section 23 may be in the first state when the test is not performed or after the test is completed. At this time, the test section 23 is attached onto the backlight surface, and the connection port 231 is located within the edge of the display substrate 1, so as to prevent the connection port 231 from protruding out from the edge of the display substrate 1 and interfering with other structures, so that the display panel may be installed normally.

Figure 2:
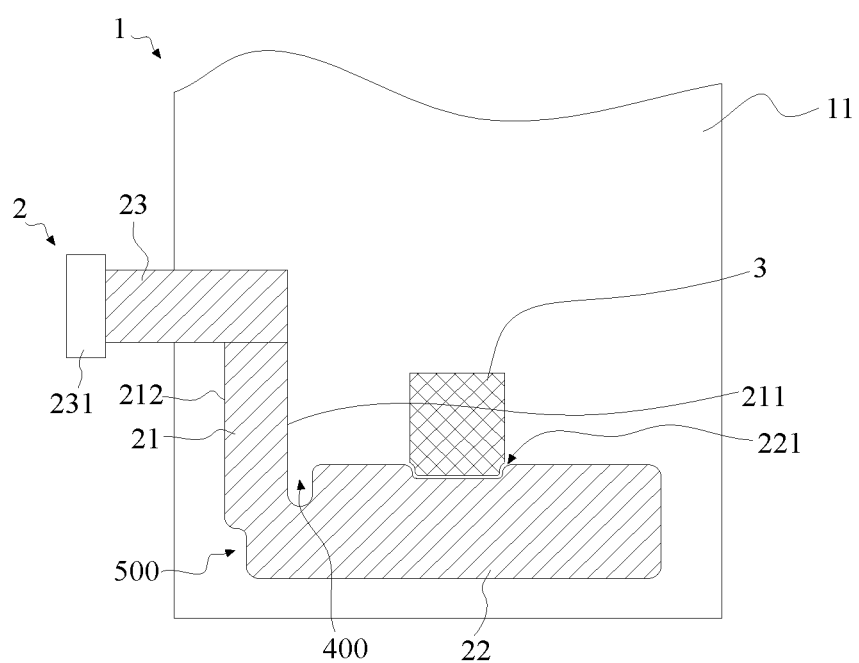
FIG. 2 is a partial top view of a test section in a second state of the display panel according to an embodiment of the present disclosure.
Figure 3:
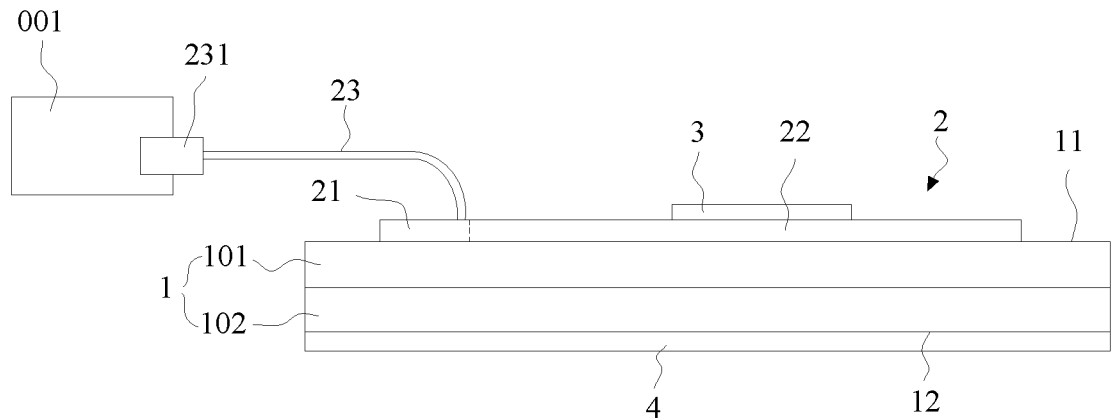
FIG. 3 is a side view of a test section in the second state of the display panel according to an embodiment of the present disclosure.

As shown in FIG. 2 and FIG. 3, when the display panel needs to be tested, the flexibility of the test section 23 may be used to fold the test section 23 into the second state. At this time, the connection port 231 protrudes out from the edge of the display substrate 1, such that it is connected to the test device 001 for testing.

Since the side of the test section 23 close to the fixed section 22 and the first side 211 are in a transitional connection through the crack relief groove 100, the corner of the test section 23 and the connection section 21 is prevented from being torn due to folding of the test section 23. At the same time, the crack relief groove 100 is beneficial to enable the test section 23 to be folded within a larger range, thus preventing the "dead bend" phenomenon where the test section 23 cannot recover from the second state to the first state.

In addition, in the extension direction of the orthographic projection of the first side 211 on the backlight surface 11, the depth of the crack relief groove 100 is not greater than 10% of the width of the test section. This helps to prevent the crack relief groove 100 from being too wide and affecting the wiring of the test section 23. Further, this also helps to avoid that the corner where the test section 23 and the connection section 21 are connected is too narrow, causing the local strength too low.

Each part of the display panel in an embodiment of the present disclosure will be described in detail below.

As shown in FIGS. 1-3, the display substrate 1 may have a backlight surface 11 and a light emission surface 12 opposite to each other. The light emission surface 12 is configured to emit light for image display. The display substrate 1 may be an Organic Light-Emitting Diode (OLED) display substrate, a liquid crystal display substrate, a micro Light-Emitting Diode (micro LED) display substrate, or the like. Taking an OLED display substrate as an example, in some embodiments of the present disclosure, the display substrate 1 includes a drive backplane 101 and a light-emitting device layer 102 disposed on one side of the drive backplane 101. The light-emitting device layer 102 may include a plurality of light-emitting units. The drive backplane 101 may drive each light-emitting unit to emit light independently for image display. The specific display principle will not be described in detail here. The backlight surface 11 may be a surface of the drive backplane 101 facing away from the light-emitting device layer 102. The light emission surface 12 may be a surface of the light-emitting device layer 102 facing away from the drive backplane 101.

As shown in FIGS. 1-4, the main flexible circuit board 2 is arranged on the backlight surface 11 of the display substrate 1, and the main flexible circuit board 2 may include a connection section 21, a fixed section 22 and a test section 23. The connection section 21 is connected between the fixed section 22 and the test section 23.

Figure 4:
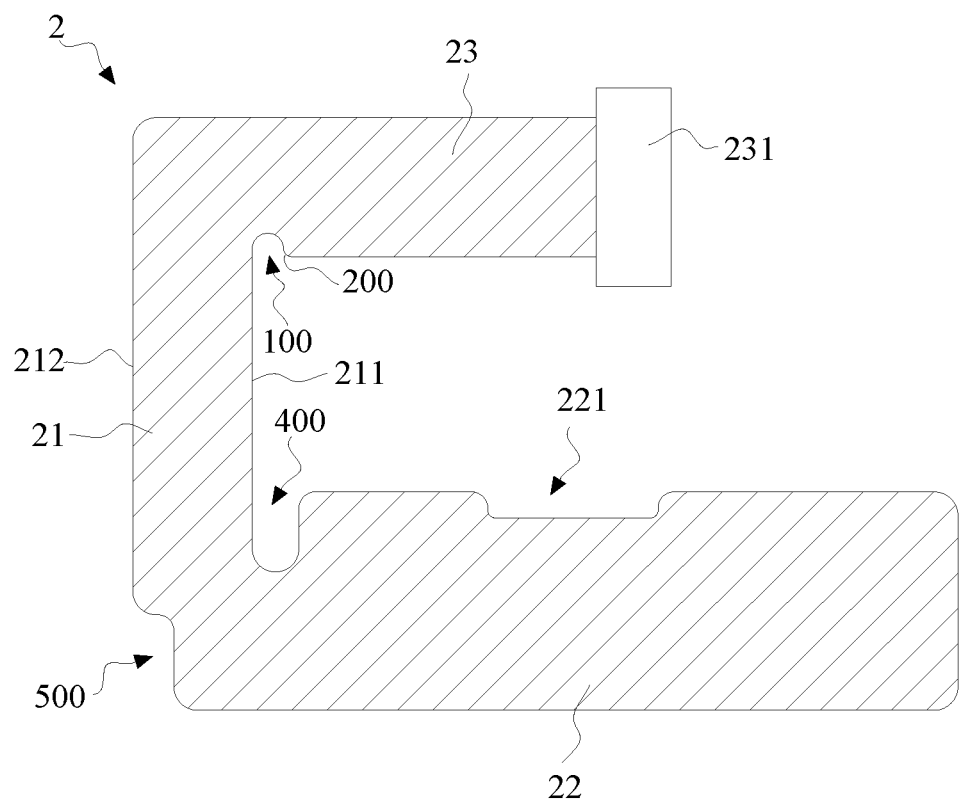
FIG. 4 is a schematic diagram of the main flexible circuit board in the first state of the display panel in a first embodiment of the present disclosure.

As shown in FIG. 4, the outer peripheral surface of the connection section 21 may include a first side 211 and a second side 212 opposite to each other. The first side 211 may extend in a direction parallel to one side of the display substrate 1. For example, the orthographic projection of the connection section 21 on the backlight surface 11 is a rectangle. The first side 211 and the second side 212 may be sides corresponding to two opposite sides of the rectangle. The distance between the first side 211 and the second side 212 is not particularly limited here. For example, the distance between the first side 211 and the second side 212 may be from 8 mm to 12 mm, such as 10.7 mm.

In some embodiments of the present disclosure, the connection section 21 is a flexible structure. For example, the connection section 21 may include a flexible substrate made of polyimide or other flexible materials, and further include a circuit formed on the flexible substrate. When the test section 23 is in the first state, the connection section 21 may be in detachable contact with the backlight surface 11. That is, when the test section 23 is in the first state, the connection section 21 is freely attached onto the backlight surface 11, and may be at least partially separated from the backlight surface 11 due to folding under the effect of an external force.

In other embodiments of the present disclosure, the connection section 21 may also be fixed on the backlight surface 11 by bonding, welding, or other means.

As shown in FIG. 1, the fixed section 22 may be attached onto the backlight surface 11, and the fixed section 22 may be fixed to the backlight surface 11 by bonding, welding, or other methods. One end of the fixed section 22 is connected to the first side 211. The other end of the fixed section 22 extends in a direction away from the connection section 21. The fixed section 22 may also be a flexible structure. For example, the fixed section 22 may include a flexible substrate made of polyimide or other flexible materials, and further include a circuit formed on the flexible substrate.

In some embodiments of the present disclosure, the orthographic projection of the fixed section 22 on the backlight surface 11 is a rectangle. One end of the fixed section 22 corresponding to a short side of the rectangle is connected to the first side 211, and another end of the fixed section 22 corresponding to the other short side of the rectangle extends in a direction away from the connection section 21, that is, extending towards an end of the first side 211 away from the second side 212. The distance between the sides of the fixed section 22 corresponding to the two short sides of the rectangle may be from 65 mm to 38 mm, for example, 66.95 mm. The distance refers to the length of the fixed section 22 along the direction away from the connection section 21.

Further, the extension direction of the fixed section 22 may be perpendicular to the extension direction of the connection section 21, that is, being perpendicular to the first side 211.

As shown in FIG. 1-FIG. 4, one end of the test section 23 is connected to the first side 211, and the other end of the test section 23 has a connection port 231. The specific structure of the connection port 231 depends on the test device 001 to be connected, which is not specified here, as long as it can be connected to the test device 001 in a pluggable way and can transmit test signals.

The test section 23 is a flexible structure, and the test section 23 may also be a flexible structure. For example, the test section 23 may include a flexible substrate made of polyimide or other flexible materials, and further include a circuit formed on the flexible substrate.

In some embodiments of the present disclosure, the connection section 21, the fixed section 22 and the test section 23 of the main flexible circuit board 2 may share the same flexible substrate. That is, the connection section 21, the fixed section 22 and the test section 23 may form an integrated structure. The circuits of the main flexible circuit board 2 are distributed among the connection section 21, the fixed section 22 and the test section 23. The fixed section 22 is provided with a circuit binding area so as to bind the main flexible circuit board 2 with other circuit boards.

The test section 23 may be switched between the first state and the second state. As shown in FIG. 4, the first state may be an untested or tested state. In the first state, the test section 23 is attached to the backlight surface 11 and extends in a direction away from the connection section 21. At this time, the connection section 21, the fixed section 22 and the test section 23 form a U-shaped structure. Of course, the lengths of the fixed section 22 and the test section 23 may be different. At the same time, the connection port 231 is located within the edge of the display substrate 1. That is, the orthographic projection of the test section 23 on the backlight surface 11 is located within the backlight surface 11, so that the test section 23 does not protrude out from the edge of the display substrate 1. This is convenient for installation in the terminal apparatus and avoids interference with other structures.

At the same time, in the first state, the distance between a side of the test section 23 close to the fixed section 22 and a side of the test section 23 away from the fixed section 22 may be the same as the distance between the first side 211 and the second side 212 of the connection section 21. Of course, they may also be different. For example, both of them may be 10.4 mm.

As shown in FIGS. 2 and 3, the test section 23 in the first state may be folded such that it is changed into the second state. In the second state, at least a part of the test section 23 is separated from the backlight surface 11, and folded towards an end of the second side 212 away from the first side 211, and further the connection port 231 extends out of the edge of the display substrate 1 to facilitate connection with the test device 001. After the test is completed, the test section 23 may be released to restore into the first state.

The side of the test section 23 close to the fixed section 22 is in a transitional connection with the first side 211 through the crack relief groove 100. That is, the crack relief groove 100 is disposed at the corner where the test section 23 is connected with the first side 211 of the connection section 21. In the meanwhile, the crack relief groove 100 penetrates through the main flexible circuit board 2 in a direction perpendicular to the backlight surface 11. That is, in a direction perpendicular to the backlight surface 11, the crack relief groove 100 exposes the backlight surface 11. When the test section 23 is folded from the first state into the second state, the crack relief groove 100 helps to prevent the test section 23 from tearing, and at the same time, the crack relief groove 100 helps to reduce the risk of "dead break" for the test section 23.

The specific implementations of the crack relief groove 100 are exemplified below.

Figure 5:
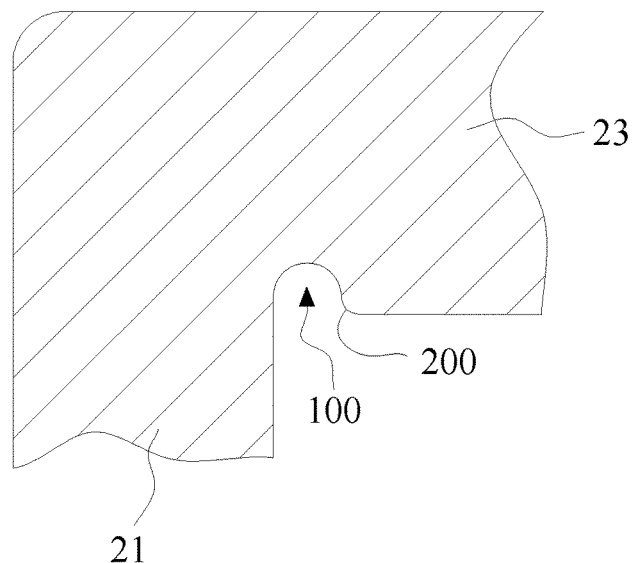
FIG. 5 is a partial schematic view of the main flexible circuit board in FIG. 4.
Figure 6:
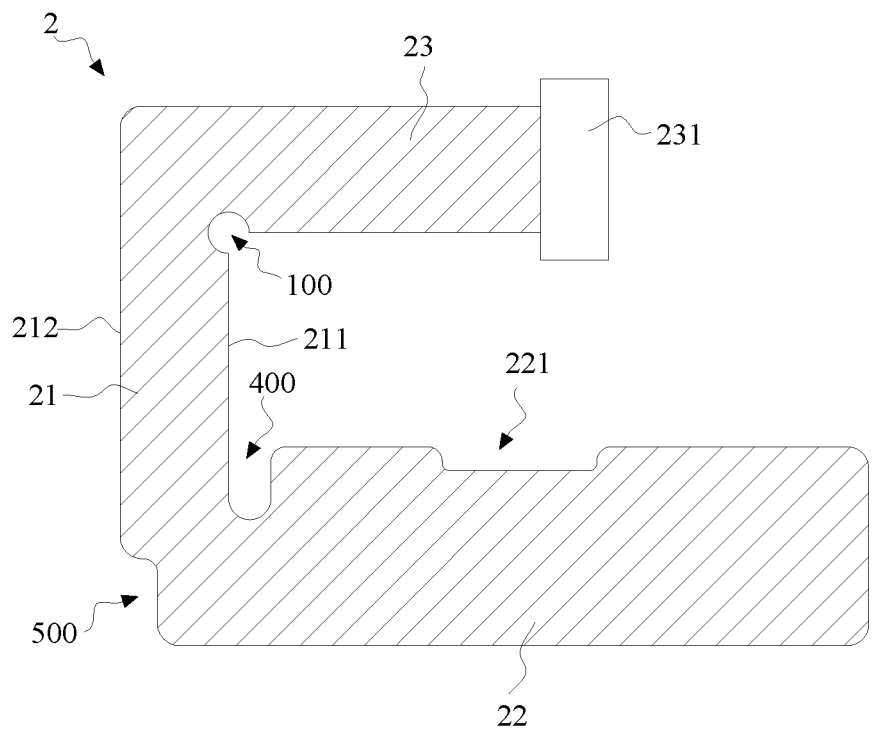
FIG. 6 is a schematic diagram of the main flexible circuit board in the first state of the display panel according to a second embodiment of the present disclosure.

As shown in FIGS. 4-6, in some embodiments of the present disclosure, the orthographic projection of the crack relief groove 100 on the backlight surface 11 is arc-shaped, such as in a circular arc or an elliptical arc shape.

As shown in FIGS. 4 and 5, in a first embodiment of the present disclosure, the first side 211 and the side of the test section 23 close to the fixed section 22 are planes perpendicular to each other. The shape of the orthographic projection of the crack relief groove 100 on the backlight surface 11 is a circular arc. The crack relief groove 100 and the side of the test section 23 close to the fixed section 22 are in a smooth and transitional connection through an arc-shaped transition surface 200. The crack relief groove 100 is in a smooth and transitional connection with the first side 211. The first side 211 is tangent to the crack relief groove 100.

Further, as shown in FIG. 4 and FIG. 5, the orthographic projection of the crack relief groove 100 on the backlight surface 11 and the orthographic projection of the transition surface 200 on the backlight surface 11 are arcs with the same radius, and the two arcs are tangent to each other. The radius may be 0.5 mm.

Figure 7:
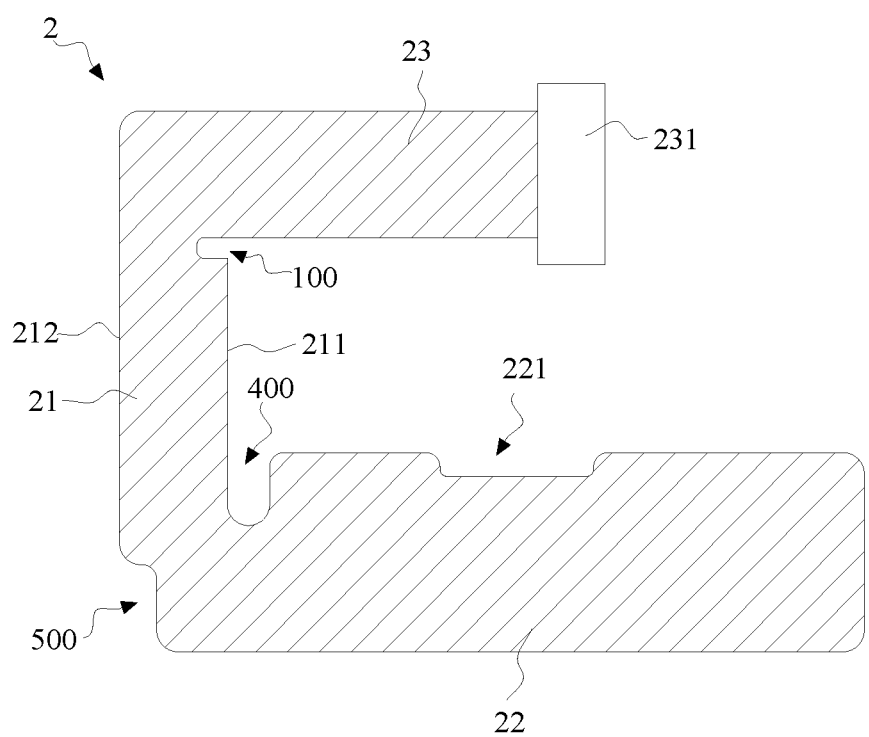
FIG. 7 is a schematic diagram of the main flexible circuit board in the first state of the display panel according to a third embodiment of the present disclosure.

As shown in FIG. 7, in a third embodiment of the present disclosure, the first side 211 and the side of the test section 23 close to the fixed section 22 are planes perpendicular to each other. The orthographic projection of the crack relief groove 100 on the backlight surface 11 is U-shaped. The crack relief groove 100 has two opposite side walls. One side wall of the crack relief groove 100 is coplanar with the side of the test section 23 close to the fixed section 22, and the other side wall of the crack relief groove 100 intersects with the first side 211, where the intersection may be a perpendicular intersection.

Of course, in other embodiments of the present disclosure, one side wall of the crack relief groove 100 intersects with the side of the test section 23 close to the fixed section 22, and the other side wall of the crack relief groove 100 is coplanar with the first side 211.

Figure 8:
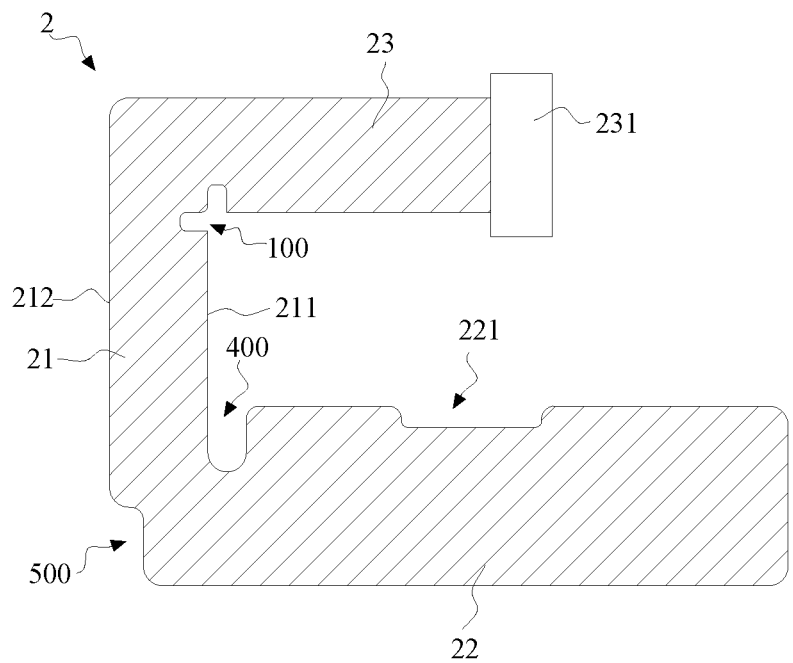
FIG. 8 is a schematic diagram of the main flexible circuit board in the first state of the display panel according to a fourth embodiment of the present disclosure.

As shown in FIG. 8, in a fourth embodiment of the present disclosure, the number of crack relief grooves 100 is multiple, and the multiple crack relief grooves 100 are sequentially connected between the first side 211 and the side of the test section 23 close to the fixed section 22. The two adjacent crack relief grooves 100 are in a smooth and transitional connection through a smooth curved surface. The shape of the orthographic projection of each crack relief groove 100 on the backlight surface 11 may be the same, for example, all being U-shaped. Of course, shapes of the orthographic projections of different crack relief grooves 100 on the backlight surface 11 may also be different.

For example, the number of crack relief grooves 100 is two, and the orthographic projections of the two crack relief grooves 100 on the backlight surface 11 are both U-shaped. The U-shaped openings are oriented perpendicular to each other.

Figure 9:
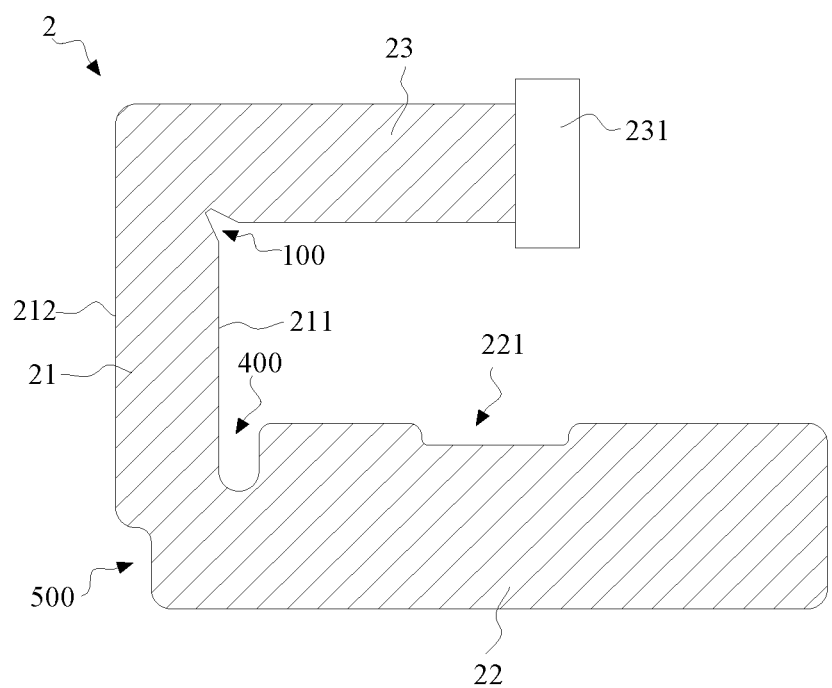
FIG. 9 is a schematic diagram of the main flexible circuit board in the first state of the display panel according to a fifth embodiment of the present disclosure.

As shown in FIG. 9, in a fifth embodiment of the present disclosure, the crack relief groove 100 has two opposite side walls, and the distance between the two side walls gradually decreases toward the second side 212. For example, the orthographic projection of the crack relief groove 100 on the backlight surface 11 is in a V shape, and the two side walls are two intersecting planes with an included angle less than 90°.

In addition, in the extension direction of the orthographic projection of the first side 211 on the backlight surface 11, the depth of the crack relief groove 100 is not greater than 10% of the width of the test section 23. The depth of the crack relief groove 100 in the extension direction refers to, in this extension direction, the distance between a point on the crack relief groove 100 that is farthest from the surface of the test section 23 close to the fixed section 22, and the surface of the test section 23 close to the fixed section 22.

For example, the orthographic projection of the connection section 21 on the backlight surface 11 is a rectangle, the first side 211 corresponds to a long side of the rectangle, and the extension direction of the orthographic projection of the first side 211 on the backlight surface 11 is the longitudinal direction of the rectangle. In connection with the crack relief groove 100 described in the first embodiment, the width of the test section 23 in the longitudinal direction is 10.4 mm, and the orthographic projection of the crack relief groove 100 on the backlight surface 11 and the orthographic projection of the transition surface 200 on the backlight surface 11 are arcs with a radius of 0.5 mm. That is, the depth of the crack relief groove 100 in the longitudinal direction is 1 mm.

Figure 10:
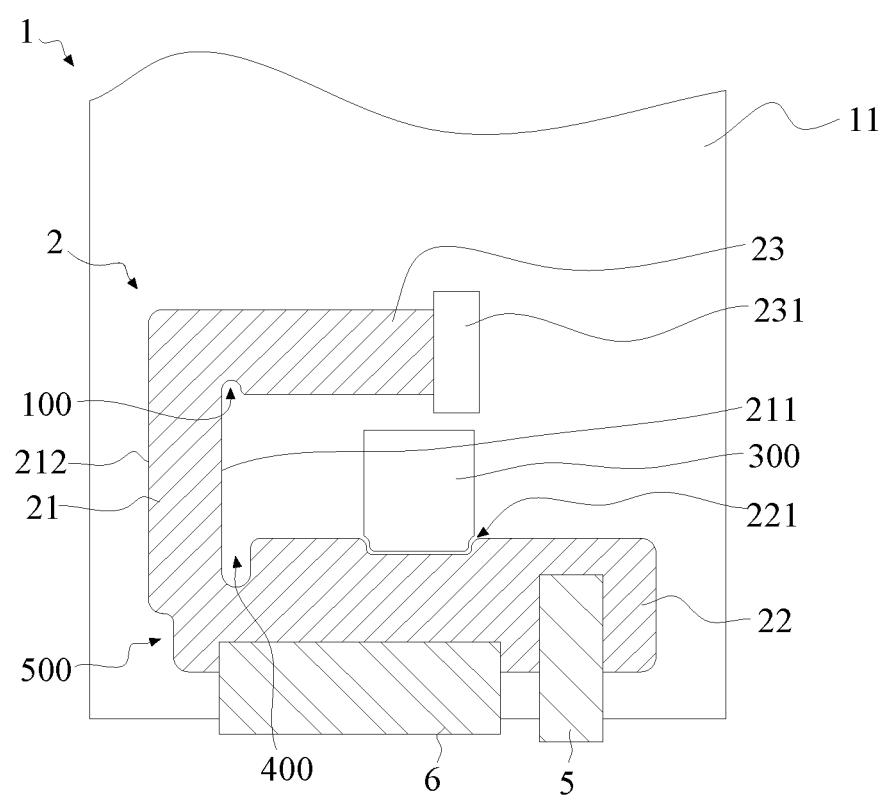
FIG. 10 is a schematic diagram of the main flexible circuit board and the light-transmissive area in the first state of the display panel in an embodiment of the present disclosure.

In addition, the display panel in an embodiment of the present disclosure may also have an under-screen fingerprint recognition function. As shown in FIG. 1, FIG. 2, and FIG. 10, in some embodiments of the present disclosure, the display substrate 1 may have a light-transmissive area 300. The light-transmissive area 300 may be an open structure, a transparent solid structure. At the same time, the display panel may further include a fingerprint sense unit 3. The fingerprint sense unit 3 may be arranged on the backlight surface 11. The light-transmissive area 300 is located within the projection of the fingerprint sense unit 3 on the backlight surface 11. The fingerprint sense unit 3 may include a photoelectric sensor, used to sense the light reflected by the valley ridges of the fingers, for generating a signal reflecting the fingerprint information.

In order to prevent the light-transmissive area 300 and the fingerprint sense unit 3 from being blocked by the main flexible circuit board 2, the light-transmissive area 300 and the fingerprint sense unit 3 may be located between the fixed section 22 and the test section 23 in the first state.

Further, as shown in FIG. 10, the side of the fixed section 22 close to the test section 23 may be provided with an avoidance hole 221. The avoidance hole 221 penetrates through the fixed section 22 in a direction perpendicular to the backlight surface 11. A partial outline of the light-transmissive area 300 is located in the avoidance hole 221 and matches the avoidance hole 221 in shape.

In some embodiments of the present disclosure, as shown in FIG. 4, the surface of the fixed section 22 close to the test section 23 may be in a smooth and transitional connection with the first side 211 through a connection groove 400. The connection groove 400 penetrates through the main flexible circuit board 2 in a direction perpendicular to the backlight surface 11.

For example, the orthographic projection of the connection groove 400 on the backlight surface 11 may be U-shaped, including two opposite side walls. One of the two side walls is coplanar with the first side 211, and the other side wall intersects (e.g. perpendicularly) with the surface of the fixed section 22 close to the test section 23.

In some embodiments of the present disclosure, as shown in FIG. 4, the surface of the fixed section 22 facing away from the test section 23 may be in a smooth and transitional connection with the second side 212 through an avoidance notch 500. The avoidance notch 500 may penetrate through the main flexible circuit board 2 in a direction perpendicular to the backlight surface 11.

Figure 11:
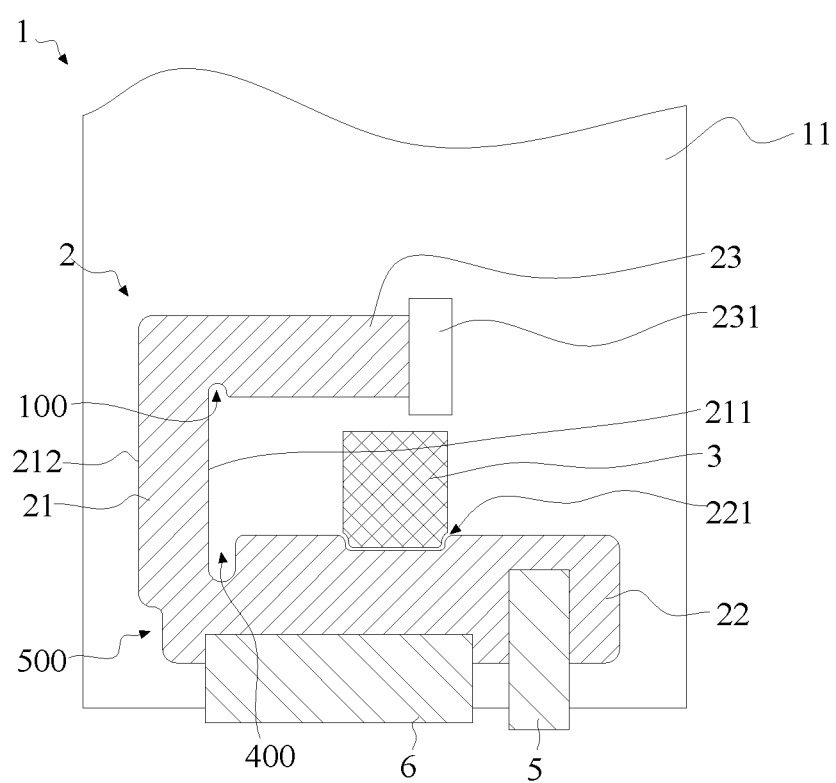
FIG. 11 is a schematic diagram of a chip-on-film flexible circuit board and a flexible touch circuit board of the display panel in an embodiment of the present disclosure.

Further, in some embodiments of the present disclosure, as shown in FIG. 2 and FIG. 11, the display panel may further include a touch layer 4 and a flexible touch circuit board 5.

The display substrate 1 may further include a touch layer 4 and a flexible touch circuit board 5. The touch layer 4 may include touch electrodes. The touch electrodes may be installed on a side of the light emission surface 12 of the display substrate 1 away from the backlight surface 11 by means of external hanging, or may be integrated into the display substrate 1. The specific principle and structure of the touch layer 4 are not particularly limited here, as long as the touch function can be realized.

The flexible touch circuit board 5 is connected to the touch layer 4, folded to the backlight surface 11, and connected to the fixed section 22. The flexible touch circuit board 5 may be used for outputting drive signals to the touch layer 4, and determining the touch area according to the feedback from the touch layer 4.

In addition, as shown in FIG. 11, the display panel in an embodiment of the present disclosure may further include a chip-on-film (COF) flexible circuit board 6. The chip-on-film flexible circuit board 6 is connected to the display substrate 1, folded to the backlight surface 11, and connected with the fixed section 22.

The display substrate 1 includes a drive backplane 101 and a light-emitting device layer 102 disposed on one side of the drive backplane 101. The drive backplane 101 has a binding area exposed by the light-emitting device layer 102. One end of the chip-on-film flexible circuit board 6 may be bound to the binding area, and the other end of the chip-on-film flexible circuit board 6 is folded to the backlight surface 11 and connected to the fixed section 22. This renders the main flexible circuit board 2 to transmit signals to the display substrate 1 for controlling the image display.

Embodiments of the present disclosure provide a display device. The display device may include the display panel described in any of the above-mentioned embodiments. The specific structure of the display panel will not be repeated here. For the beneficial effects of the display device, the above-mentioned display panel may be referred to, and no further details is provided here.

Embodiments of the present disclosure further provide a terminal apparatus. The terminal apparatus may include the above-mentioned display device. For the beneficial effects of the terminal apparatus, the above-mentioned display panel and display device may be referred to, which will not be repeated here. The terminal apparatus in an embodiment of the present disclosure may be an electronic device with an image display function, such as mobile phone, tablet computer, TV, etc., which will not be listed one by one here.

Other embodiments of the present disclosure will readily occur to those skilled in the art upon consideration of the specification and practice of the content disclosed herein. The present application is intended to cover any variations, uses, or adaptations of the present disclosure that follow the general principle of the present disclosure and include common knowledge or techniques in the technical field not disclosed by the present disclosure. The specification and examples are to be regarded as exemplary only, with the true scope and spirit of the present disclosure being indicated by the appended claims.

The invention claimed is:

1. A display panel, comprising:
  a display substrate having a backlight surface; and
  a main flexible circuit board, wherein the main flexible circuit board comprises:
    a connection section arranged on the backlight surface, and having an outer peripheral surface comprising a first side and a second side opposite to each other;
    a fixed section attached and fixed onto the backlight surface, and having one end connected to the first side and another end extending towards an end of the first side away from the second side; and
    a test section having one end connected to the first side, and another end comprising a connection port, wherein;
    a side of the test section close to the fixed section is in a transitional connection with the first side through a crack relief groove;
    the crack relief groove penetrates through the main flexible circuit board in a direction perpendicular to the backlight surface;
    in an extension direction of an orthographic projection of the first side on the backlight surface, a depth of the crack relief groove is not greater than 10% of a width of the test section;
    the test section is a flexible structure configured to switch between a first state and a second state;
    in the first state, the test section is attached onto the backlight surface, and the connection port is located within an edge of the display substrate; and
    in the second state, at least a part of the test section is separated from the backlight surface, and is folded towards an end of the second side away from the first side, and the connection port extends out of the edge of the display substrate.

2. The display panel according to claim 1, wherein an orthographic projection of the crack relief groove on the backlight surface is arc-shaped.

3. The display panel according to claim 2, wherein
  the crack relief groove is in a smooth and transitional connection with a side of the test section close to the fixed section through an arc-shaped transition surface; and
  the crack relief groove is in a smooth and transitional connection with the first side.

4. The display panel according to claim 3, wherein the orthographic projection of the crack relief groove on the backlight surface and an orthographic projection of the transition surface on the backlight surface are equal in radius.

5. The display panel according to claim 4, wherein the orthographic projection of the crack relief groove on the backlight surface and the orthographic projection of the transition surface on the backlight surface have a radius from 0.3 mm to 0.7 mm.

6. The display panel according to claim 1, wherein
  an orthographic projection of the crack relief groove on the backlight surface is in a U shape; and
  the crack relief groove has two opposite side walls, one of the two opposite side walls being coplanar with a side of the test section close to the fixed section, and the other of the two opposite side walls intersecting with the first side.

7. The display panel according to claim 1, wherein the crack relief groove has two opposite side walls, and a distance between the two opposite side walls gradually decreases towards the second side.

8. The display panel according to claim 1, wherein the connection section is a flexible structure and configured to make detachable contact with the backlight surface when the test section is in the first state.

9. The display panel according to claim 1, wherein
  the display substrate comprises a light-transmissive area located between the fixed section and the test section in the first state; and
  the display panel also comprises a fingerprint sense unit arranged on the backlight surface, and located between the fixed section and the test section in the first state, wherein the light-transmissive area is located within an projection of the fingerprint sense unit on the backlight surface.

10. The display panel according to claim 9, wherein
  a side of the fixed section close to the test section is provided with an avoidance hole, configured to penetrate through the fixed section in a direction perpendicular to the backlight surface; and
  a partial outline of the light-transmissive area is located in the avoidance hole and matches the avoidance hole in shape.

11. The display panel according to claim 1, wherein
  a side of the fixed section close to the test section is in a smooth and transitional connection with the first side through a connection groove, and
  the connection groove penetrates through the main flexible circuit board in a direction perpendicular to the backlight surface.

12. The display panel according to claim 1, further comprising:
  a touch layer disposed on a side of the display substrate away from the backlight surface or integrated in the display substrate; and
  a flexible touch circuit board connected with the touch layer, folded to the backlight surface, and connected with the fixed section.

13. A display device, comprising a display panel, wherein the display panel comprises:
  a display substrate having a backlight surface; and
  a main flexible circuit board, wherein the main flexible circuit board comprises:
    a connection section arranged on the backlight surface, and having an outer peripheral surface comprising a first side and a second side opposite to each other;
    a fixed section attached and fixed onto the backlight surface, and having one end connected to the first side and another end extending towards an end of the first side away from the second side; and
    a test section having one end connected to the first side, and another end comprising a connection port, wherein:

a side of the test section close to the fixed section is in a transitional connection with the first side through a crack relief groove;

the crack relief groove penetrates through the main flexible circuit board in a direction perpendicular to the backlight surface;

in an extension direction of an orthographic projection of the first side on the backlight surface, a depth of the crack relief groove is not greater than 10% of a width of the test section;

the test section is a flexible structure configured to switch between a first state and a second state;

in the first state, the test section is attached onto the backlight surface, and the connection port is located within an edge of the display substrate; and in the second state, at least a part of the test section is separated from the backlight surface, and is folded towards an end of the second side away from the first side, and the connection port extends out of the edge of the display substrate.

14. The display device according to claim 13, wherein an orthographic projection of the crack relief groove on the backlight surface is arc-shaped.

15. The display device according to claim 13, wherein:
an orthographic projection of the crack relief groove on the backlight surface is in a U shape; and
the crack relief groove has two opposite side walls, one of the two opposite side walls being coplanar with a side of the test section close to the fixed section, and the other of the two opposite side walls intersecting with the first side.

16. The display device according to claim 13, further comprising a plurality of crack relief grooves sequentially connected between the first side and a side of the test section close to the fixed section, with two adjacent ones of the plurality of crack relief grooves being in a smooth and transitional connection.

17. A terminal apparatus, comprising a display device, wherein the display device comprises a display panel, and the display panel comprises:
a display substrate having a backlight surface; and
a main flexible circuit board, wherein the main flexible circuit board comprises:

a connection section arranged on the backlight surface, and having an outer peripheral surface comprising a first side and a second side opposite to each other;

a fixed section attached and fixed onto the backlight surface, and having one end connected to the first side and another end extending towards an end of the first side away from the second side; and a test section having one end connected to the first side, and another end comprising a connection port, wherein:

a side of the test section close to the fixed section is in a transitional connection with the first side through a crack relief groove;

the crack relief groove penetrates through the main flexible circuit board in a direction perpendicular to the backlight surface;

in an extension direction of an orthographic projection of the first side on the backlight surface, a depth of the crack relief groove is not greater than 10% of a width of the test section;

the test section is a flexible structure configured to switch between a first state and a second state;

in the first state, the test section is attached onto the backlight surface, and the connection port is located within an edge of the display substrate; and in the second state, at least a part of the test section is separated from the backlight surface, and is folded towards an end of the second side away from the first side, and the connection port extends out of the edge of the display substrate.

18. The terminal apparatus according to claim 17, wherein an orthographic projection of the crack relief groove on the backlight surface is arc-shaped.

19. The terminal apparatus according to claim 17, wherein:
an orthographic projection of the crack relief groove on the backlight surface is in a U shape; and
the crack relief groove has two opposite side walls, one of the two opposite side walls being coplanar with a side of the test section close to the fixed section, and the other of the two opposite side walls intersecting with the first side.

* * * * *